(12) United States Patent
Vetsch

(10) Patent No.: US 7,170,433 B1
(45) Date of Patent: Jan. 30, 2007

(54) ANALOG I/O BOARD PROVIDING ANALOG-TO-DIGITAL CONVERSION AND HAVING A TWO-LEVEL BUFFER THAT ALLOWS DEMAND BASED ACCESS TO CONVERTED DATA

(75) Inventor: Michael A. Vetsch, Sassel (CH)

(73) Assignee: The Mathworks, Inc., Natick, MA (US)

( * ) Notice: Subject to any disclaimer, the term of this patent is extended or adjusted under 35 U.S.C. 154(b) by 0 days.

(21) Appl. No.: 11/157,294

(22) Filed: Jun. 20, 2005

(51) Int. Cl.
*H03M 1/06* (2006.01)

(52) U.S. Cl. .................... 341/120; 341/118

(58) Field of Classification Search ............... 341/155, 341/60, 143, 87, 118, 120, 161; 711/109, 711/122, 137, 146, 171; 326/41, 31; 358/537; 360/39; 370/400; 455/73; 713/400; 327/94, 327/96

See application file for complete search history.

(56) References Cited

U.S. PATENT DOCUMENTS

| | | | | |
|---|---|---|---|---|
| 3,480,931 A * | 11/1969 | Geissler et al. | ............... | 360/39 |
| 4,991,172 A * | 2/1991 | Cidon et al. | ............... | 370/400 |
| 5,200,749 A * | 4/1993 | Crosby et al. | ............... | 341/87 |
| 5,289,584 A * | 2/1994 | Thome et al. | ............... | 711/109 |
| 5,535,137 A * | 7/1996 | Rossmere et al. | ............... | 358/537 |
| 5,539,893 A * | 7/1996 | Thompson et al. | ............... | 711/122 |
| 5,606,320 A * | 2/1997 | Kleks | ............... | 341/161 |
| 5,859,860 A * | 1/1999 | Whetsel | ............... | 714/727 |
| 5,880,616 A * | 3/1999 | Park et al. | ............... | 327/333 |
| 5,974,516 A * | 10/1999 | Qureshi | ............... | 711/171 |
| 6,184,726 B1 * | 2/2001 | Haeberli et al. | ............... | 327/96 |
| 6,253,291 B1 * | 6/2001 | Pong et al. | ............... | 711/146 |
| 6,467,030 B1 * | 10/2002 | Arimilli et al. | ............... | 711/137 |
| 6,665,807 B1 * | 12/2003 | Kondo et al. | ............... | 713/400 |
| 6,697,006 B1 * | 2/2004 | McCartney et al. | ............... | 341/155 |
| 6,710,728 B2 * | 3/2004 | Gude | ............... | 341/143 |
| 6,777,979 B1 * | 8/2004 | Zhu et al. | ............... | 326/41 |
| 6,903,714 B2 * | 6/2005 | Tobiya | ............... | 345/89 |
| 7,016,654 B1 * | 3/2006 | Bugeja | ............... | 455/73 |
| 2005/0116737 A1 * | 6/2005 | Pentakota et al. | ............... | 326/31 |

* cited by examiner

*Primary Examiner*—Linh Nguyen
(74) *Attorney, Agent, or Firm*—Lahive & Cockfield, LLP

(57) ABSTRACT

A system and method for converting analog signals to digital signals minimize the latency of the analog to digital conversion for real-time systems. The conversion system and method implements the hardware of an analog to digital converter input/output (I/O) board and a software-based I/O-driver in an expansion bus. The hardware of the ADC I/O board executes free-running conversion of an analog signal into digital form and stores the converted values in a first level of a buffer having two levels. Previously stored converted values are pushed to the second level of the buffer when a new value is written to the first level. The I/O driver then retrieves stored values from the second level of the buffer when needed by the real-time system and gates the buffer to prevent pushing during retrieval of values from the second level.

24 Claims, 4 Drawing Sheets

(PRIOR ART—Software-initiated conversion)

(PRIOR ART—Hardware-initiated conversion)

ANALOG I/O BOARD PROVIDING ANALOG-TO-DIGITAL CONVERSION AND HAVING A TWO-LEVEL BUFFER THAT ALLOWS DEMAND BASED ACCESS TO CONVERTED DATA

FIELD OF THE INVENTION

The present invention relates to a method of converting an analog signal to a digital signal. More particular, the present invention relates to a low-latency method of controlling the conversion of an analog signal to a digital signal that is optimized for fast controls applications.

BACKGROUND OF THE INVENTION

During testing of a unit under test, real-time systems for rapid-prototyping communicate to the unit under test via input/output boards (I/O-boards) connected to an expansion bus of the real-time target hardware. If, for example, the target hardware is PC-compatible, the expansion bus may be a PCI (peripheral component interconnect) bus. PCI is available in various mechanical form factors: standard PCI, PMC, CompactPCI, and PC/104+. The slowest component of a real-time target application will almost always be the code that accesses I/O boards via the bus (PCI). Each single 32-bit read or 32-bit write access to an I/O board via a 32 bit/33 MHz PCI bus takes approximately 0.8 µs, which is a very long time compared to the instruction execution time on a 1 GHz CPU, a read or write time from/to the first or second level cache, or even RAM access time.

The design of a high-performance real-time system will therefore try to minimize the number of PCI bus accesses to an I/O board in order to reduce overall latency associated with accessing that I/O-board. The bus accesses are usually initiated by an I/O driver, which is the interface layer between the application layer (software) and the physical layer (the PCI bus and the I/O board, respectively). An optimized I/O driver will therefore have a minimal amount of software function calls leading to bus accesses. On the other hand, the number of necessary bus accesses is also dependent on the given hardware architecture of the I/O-board. This means that overall I/O latency is influenced by both hardware (the I/O-board) and software (the I/O-driver) and only an approach which takes both into account will eventually lead to a low-latency implementation.

An I/O connectivity found almost in any real-time application is the analog to digital converter (ADC). Analog to digital converters are circuits used to convert signals from the analog domain, where the signals are represented by continuous quantities, to the digital domain, where the signals are represented by discrete numbers. This I/O-type is necessary to access analog sensor signals, such as those output from pressure sensors. From a latency perspective, analog to digital converter technology is an expensive I/O-operation, because the conversion process of the ADC has first to be initiated by the I/O driver. Then, the I/O driver waits on the conversion of an analog signal to digital form to complete. After completion of the conversion, the I/O driver reads the converted value from the ADC on the I/O-board. For each step, at least one PCI bus access is necessary, which significantly increases the time required to access information from the I/O board.

Most real-time applications require more than one analog input channel to be available. For example, most commercially available analog-to-digital I/O-boards are multi-channel boards, with sixteen channels being typical. However, most of these I/O-boards include one single analog-to-digital converter onboard for all of the channels. During conversion, the numerous analog input channels must be electronically multiplexed before leading to the ADC. The conversion of multiple analog input channels is thus a sequential process, rather than a parallel process, which leads to very high overall latency.

Two analog-to-digital conversion methods are currently commercially available in ADC I/O-boards. The first method, which is generally preferred for sample-based controls applications, is a software-initiated conversion method. FIG. 1 is a flowchart illustrating the steps involved in performing a software-initiated conversion method in the prior art. In the software-initiated conversion method, the real-time algorithm of the real-time target hardware is time-triggered by a timer source independent of the ADC I/O-board (asynchronous). When the algorithm requires a digital representation of an analog signal in an analog channel of the I/O board, the associated I/O driver initiates the conversion of the signal in step 12 and then waits for the ADC to finish the conversion in step 14. After conversion is complete, the driver reads the converted value directly from the ADC I/O-board in step 16. In step 18, the driver reads the digital signal into the real-time algorithm. Steps 12–18 are repeated whenever the real-time algorithm needs the digital representation of the analog signal. For multi-channel boards with a single ADC, this process may be required to be repeated for each channel (sequential conversion). Some board designs try to minimize the associated latency with the help of channel queue and conversion FIFO buffers. For multi-channel boards with one ADC per channel, this process can be done in parallel. Nevertheless, the software-initiated conversion method leads to a high latency implementation, because the I/O driver has to wait on the conversion to finish before reading the value from the ADC.

The second type of conversion method, which is generally preferred for frame-based DSP and/or Data Acquisition applications, is a hardware-initiated conversion method. FIG. 2 is a flowchart illustrating the steps involved in performing a hardware-initiated conversion method in the prior art. In the hardware-initiated conversion method, a clock source on the ADC I/O-board is programmed to output a conversion signal with a certain period in step 22. The conversion signal periodically initiates the analog to digital conversions of signals in the I/O board in step 24. The converted signals are then passed to the I/O driver in step 26, which feeds the digital values to the real-time algorithm in step 28. The hardware-initiated conversion has the advantage that the I/O driver does not have to initiate the conversion and therefore does not have to wait on the conversion to be completed. However, with the hardware-initiated conversion, the real-time algorithm no longer controls the time of a conversion, and initiating a conversion at any given time is no longer possible. As a consequence, it is usually the completion of the conversion of all channels which will then eventually trigger the execution of a cycle of the real-time application that uses the converted signals. This leads to a synchronous execution scheme, which can be less than ideal for certain applications, such as controls applications. In addition, the commercially available ADC I/O-board of this type are optimized for acquiring (converting) multiple sets of the chosen channels at a given rate and returning the converted values as so-called frames. For sample-based applications, with a frame size of one, these boards introduce either high latency or long group delay because of interrupt latency time or DMA (direct memory access) setup time, i.e., the time a DMA controller needs to setup a DMA transfer.

SUMMARY OF THE INVENTION

The present invention provides a system and method for controlling the conversion of analog signals to digital signals that minimize the latency of the analog to digital conversion. The conversion system and method implements the hardware of an analog to digital converter input/output (I/O) board and a software-based I/O-driver in an expansion bus. The hardware of the ADC I/O board executes free-running conversions of an analog signal into digital form and stores the converted values in a first level of a buffer having at least two levels. Previously stored converted values are pushed to the second level of the buffer when a new value is written to the first level. The I/O driver then retrieves stored values from the second level of the buffer when needed by the real-time system. In this manner, overall latency can be reduced.

According to a first aspect of the invention, a method of controlling conversion of a signal from analog form to digital form is provided, which comprises continuously converting an analog signal from an analog channel into a digital form, storing values representing the digital form of the signal in a buffer and determining whether a digital form of the signal is required by an application. If the digital form of the signal is required, the method further comprises the step of retrieving a digital value from the buffer.

According to another aspect of the invention, a method of controlling conversion of a signal from analog form to digital form is provided. The method comprises the steps of applying an analog signal to an input of an analog-to-digital converter, converting the analog signal into a first digital value using the analog-to-digital converter and buffering the first digital value in a first level of a buffer. The method may further comprise the step of pushing a stored digital value from a first level of a buffer to a second level of a buffer in the absence of a gate between the first level and the second level when the first digital value is buffered in the first level of the buffer.

According to still another aspect of the invention, a method of controlling conversion of a signal from analog form to digital form comprises the steps of providing a buffer having a first level for storing a first set of digital values and a second level for storing a second set of digital values and selectively deploying a gate to prevent transfer of data from the first level of the buffer to the second level of the buffer.

According to still another aspect of the invention, an analog-to-digital converter input-output system is provided. The system comprises an input-output board including a number of analog channels, each for conveying an analog signal, at least one analog-to-digital converter, each analog-to-digital converter having an input coupled to at least one analog channel for continuously converting data in the at least one analog channel to digital form, a double buffer having a first level coupled to an output of the analog-to-digital converter and an expansion bus configured to communicate with a second level of the buffer.

According to another aspect of the invention, a method of packing converted data in a buffer is provided. The method comprises the steps of storing digital values in first level of a buffer having N number of fields and pushing to the digital values in the first level of the buffer to a second level having M number of fields, where M is less than N.

BRIEF DESCRIPTION OF THE FIGURES

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions.

DETAILED DESCRIPTION OF THE INVENTION

The present invention provides an improved method for controlling the conversion of analog signals to digital signals with low latency. The improved method involves a free-running conversion of signals from analog to digital form, and selective retrieval of converted signal by an I/O driver. The present invention will be described below relative to illustrative embodiments. Those skilled in the art will appreciate that the present invention may be implemented in a number of different applications and embodiments and is not specifically limited in its application to the particular embodiments depicted herein.

Computer-based instrumentation systems typically include transducers for transducing a physical phenomenon into an electrical signal, signal conditioning functionality to perform amplification, isolation, and/or filtering, and analog-to-digital (A/D) conversion functionality for receiving analog signals and providing corresponding digital signals to the host computer system. In a computer-based system, the instrumentation hardware or device is typically an expansion board plugged into one of the I/O slots of the computer system.

Figure 1:
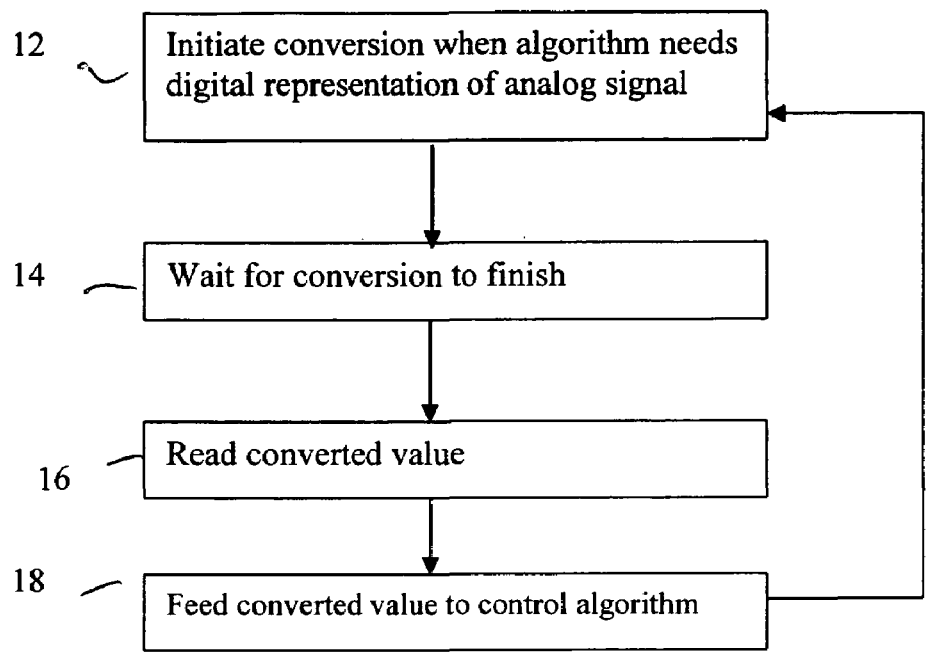
FIG. 1 is a flow chart illustrating the steps involved in a software-initiated conversion method of the prior art.
Figure 2:
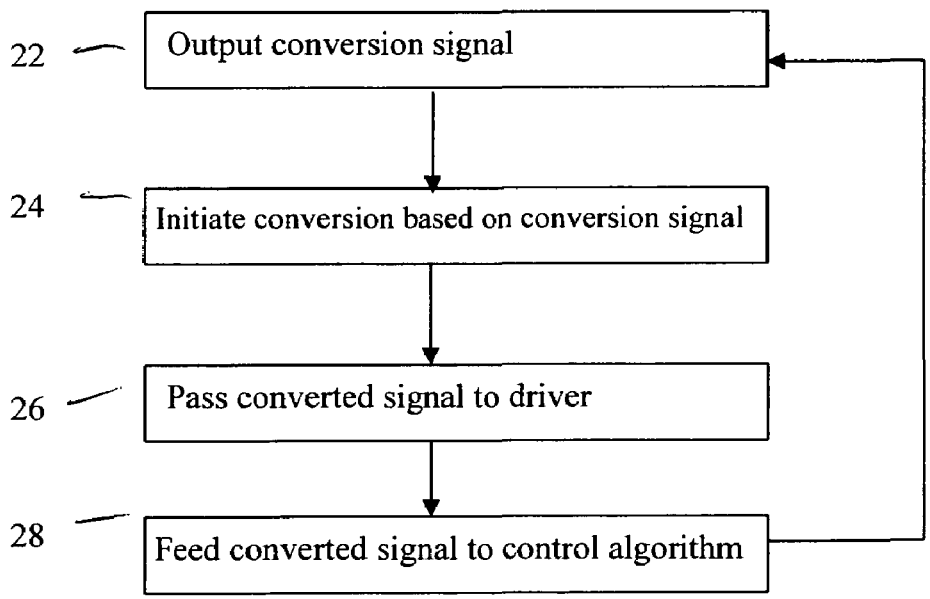
FIG. 2 is a flow chart illustrating the steps involved in a hardware-initiated conversion method of the prior art.
Figure 3:
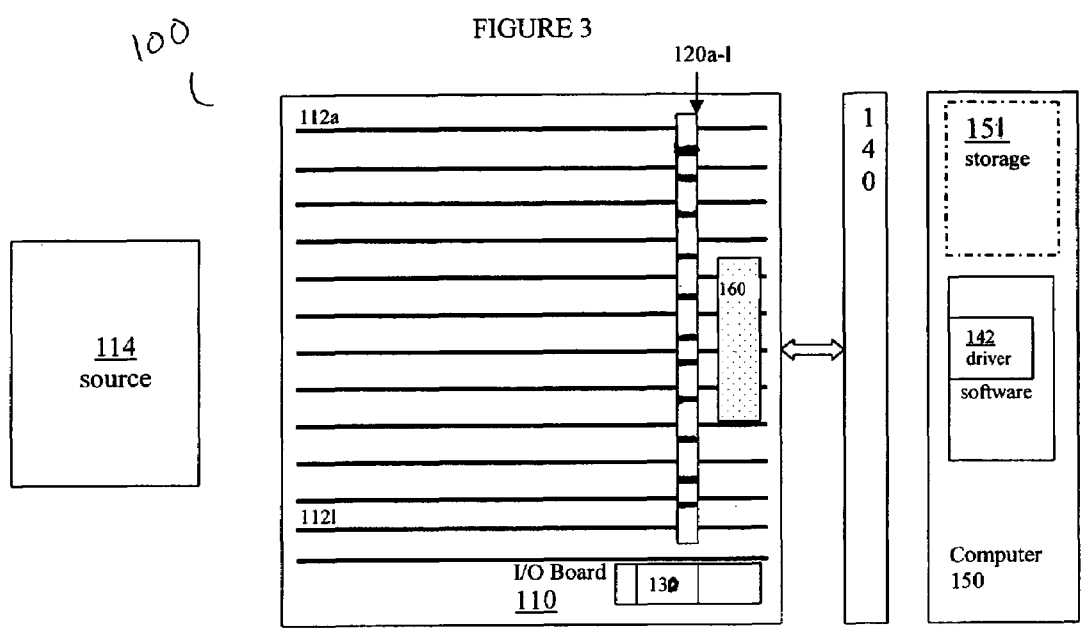
FIG. 3 illustrates a system suitable for implementing the analog-to-digital conversion method of an illustrative embodiment of the invention.

FIG. 3 is a schematic diagram of a system 100 suitable for implementing a free-running analog-to-digital conversion method according to an illustrative embodiment of the invention. The free-running ADC conversion implements both hardware and software in the system 100 to improve the efficiency of the analog-to-digital conversion process. The system 100 includes an analog I/O board 110 having analog channels 112*a*–112*l* for conveying signals having analog waveforms from a source 114, such as a sensor, that produces the analog signals. The I/O board 110 further includes additional hardware 130, which may be used for controlling operation of the board. The illustrative system 100 includes an analog-to-digital converter (ADC) 120*a*–120*l* for each analog channel 112*a*–112*l*, respectively, for converting an analog signal in each channel to digital form. In digital form, the signal is a bit string that has a plurality of bits. Intermediate memory 160 is also provided on, or in communication with, the I/O board 110 to facilitate the conversion, as described below.

In another embodiment, two or more of the channels 112 may share an ADC 120. For example, a single ADC 120a may be provided for all of the channels or for a plurality of the channels 112a–112l.

The I/O board 110 interfaces with a computer 150 via an I/O slot of a computer, such as an expansion or input/output bus, illustrated as a PCI (Peripheral Component Interconnect) bus 140. The illustrative PCI bus 140 forms a physical/electrical interconnect between the board 110 and the computer 150. The bus 140 receives the digital signals produced by each analog-to-digital converter 120a–120l and passes the converted digital signals on to a secondary storage device, such as a hard drive 151 of the computer 150, so that an application running on the computer may use the digital signals. A driver 142, which may be in the software of the computer 150, forms an application interface layer between the computer and the I/O Board 110. The driver 142 includes instructions for accessing the I/O board 110 using the PCI bus 140 to retrieve digital signals converted from analog form.

While the illustrative expansion bus 140 is a PCI expansion bus, one skilled in the art will recognize that other bus types may also be used. Examples of suitable bus types include, but are not limited to, ISA, VXI, PCMCIA, PC/104, PC/104+, and/or MicroDAQ. The expansion bus may receive the I/O board 110 in a slot to connect the I/O board to the hard drive of the computer 150 coupled to the expansion bus.

The system 100 may be any suitable system that requires conversion of an analog signal to a digital signal using an analog-to-digital converter. Examples include, but are not limited to: data acquisition systems, test and measurement systems, industrial automation systems, process control systems, audio systems, video acquisition systems, instrumentation systems and others known in the art.

Figure 4:
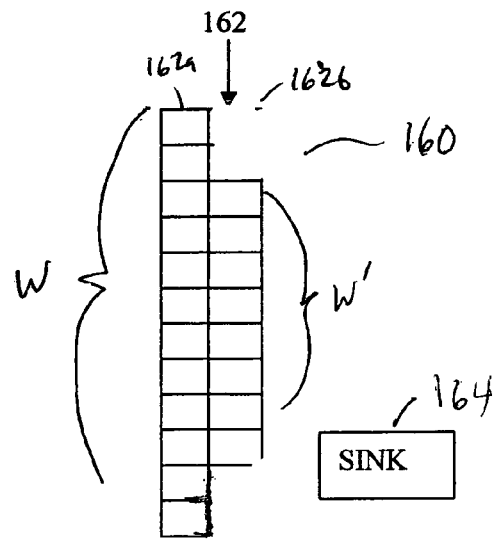
FIG. 4 illustrates the intermediate memory in the system of FIG. 3 used to implement the free-running analog-to-digital conversion method of an illustrative embodiment of the invention.

The system further includes intermediate memory 160 between the ADC conversion logic 120 and the bus 140 as described in detail below, to facilitate a free-running conversion method of the illustrative embodiment of the invention. As shown in FIG. 3, the intermediate memory is preferably on board the I/O board 110 and preferably comprises a two level first-in-first-out (FIFO) buffer. FIG. 4 illustrates an embodiment of the intermediate memory 160 between the analog to digital conversion logic 130 and the PCI bus 140 to facilitate the free-running conversion method of an illustrative embodiment of the invention. The illustrative intermediate memory 160 includes a FIFO buffer 162 for buffering converted data from each ADC 120 in the system 100. The buffer 162 allows the I/O driver 142, via the PCI bus 140, to retrieve the most recent converted data at any given time independent of the state the conversion logic 120 is currently in. The intermediate memory 160 may also include a sink 164 for sinking data not retrieved by the I/O driver 142.

The first component of the illustrative intermediate memory 160 is a double buffer 162 (length of 2 or more) in communication with the output of the ADCs 120a–120. The first level 162a of the buffer includes a plurality of fields, with each field configured individually to receive and store a newly converted digital value from each ADC. The width W of the first level 162a of the buffer is preferably equal to the number of analog input channels (or the number of ADCs) on the I/O board 110. The width W' of the second level 162b is preferably equal to the width of the PCI bus 140 accessing the second level 162b, as described below.

Data may be transferred to the second level 162b of the buffer 160 under the command of the conversion logic, as described below. For example, when a new digital value is written into the first level 162a, the conversion logic may automatically push all digital values from the first level 162a to the second level 162b. This transfer of data between the first level of the buffer and the second level, when the conversion logic gives a push command, is atomic, as described in detail below. The driver 142, when accessing converted digital data from the ADC I/O-board 110, will always read from the second level 162b of the buffer 160.

The present invention implements a free-running conversion mode that minimizes latency while ensuring that retrieved digital values are fresh. In a free-running analog-to-digital conversion method according to an illustrative embodiment of the invention, analog to digital conversions of one or more, and preferably all, selected analog input channels 112a–112l are done in an endless loop as fast as possible. The I/O driver 142 then accesses the converted signals when necessary, using the PCI bus 140. In this manner, the I/O driver 142 can immediately access a recently converted signal when necessary without waiting for initiation and conversion of a signal.

Figure 5A:
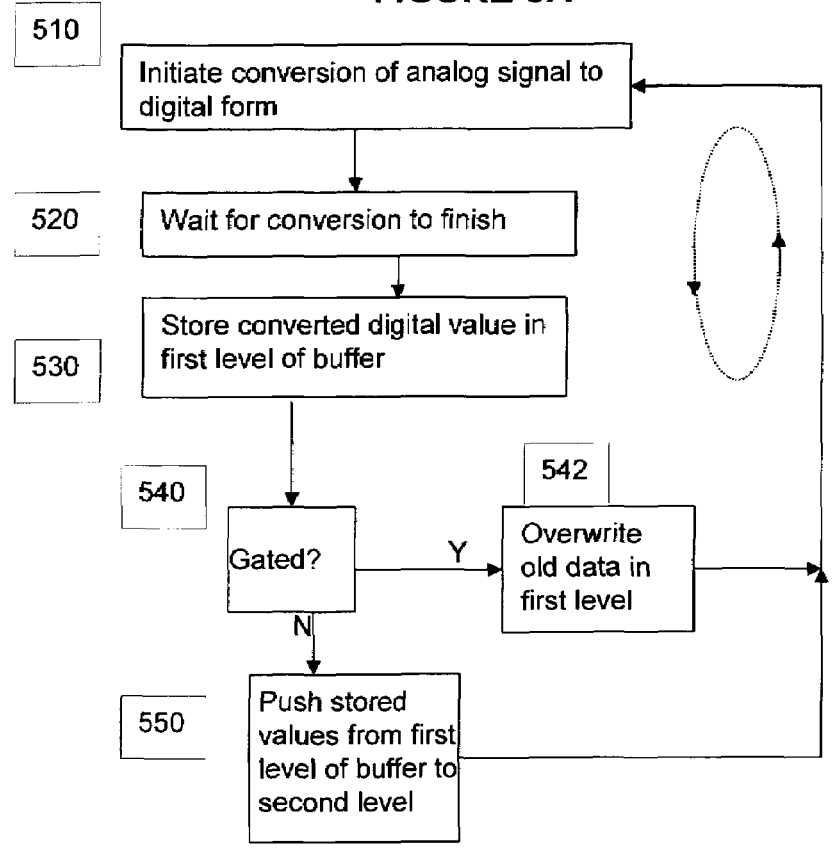
FIG. 5A and FIG. 5B illustrate the steps involved in converting an analog signal to a digital representation according to an illustrative embodiment of the invention.
Figure 5B:
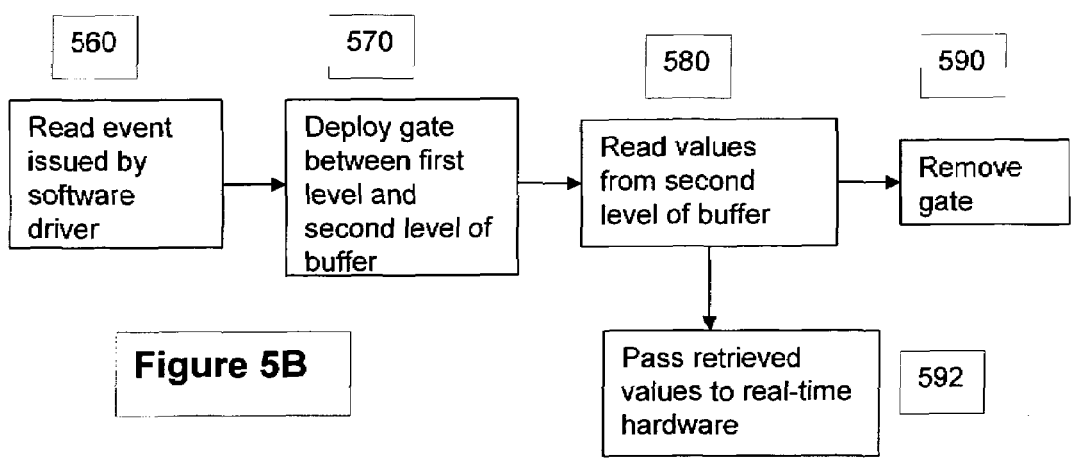

FIGS. 5A and 5B are flow charts illustrating the steps involved in converting an analog signal to a digital form in a free-running conversion mode according to an illustrative embodiment of the invention. FIG. 5A illustrates the steps continuously executed onboard the I/O board 110 in a repeated loop. The illustrative flowchart shows the steps of a single ADC 120a for converting a signal in a dedicated channel, while the other analog-to-digital converters 120b–120l in the system also convert signals in the associated channels. FIG. 5B illustrates the steps executed by the software when an application requires a converted signal from a selected channel on the I/O board. The two processes may operate in parallel and in cooperation with each other.

The method involves a free-running conversion of analog signals into digital signals. In a first step, 510 in FIG. 5A, the ADC 120a initiates conversion of the analog signal in an associated channel, regardless of whether the I/O driver 142 has requested the converted signal. The ADC preferably initiates a conversion as soon as a previous conversion is complete, or based on a periodic conversion signal from the on-board hardware logic 130. As a result, a value in the analog signal is converted to a digital value in step 510, whether the signal comprises actual data or simply noise. In step 520, the ADC waits for the conversion of a signal. In step 530, the ADC stores the recently converted digital value in the first level 162a of the buffer 162 of the intermediate memory 160.

After converting and transferring a recently converted value to the first level of the buffer, the ADC 120 attempts to push a previously stored digital value from the first level of the buffer to the second level at the same time that the most recently converted digital signal is stored in the first level. If the conversion logic has not implemented a gate (i.e., a hold on a push command), as determined in step 540, the conversion logic pushes the previously stored digital value from the first level of the buffer to the second level of the buffer in step 550. If, however, there is a gate (i.e., a hold on the push command) between the first level and the second level of the buffer, step 550 is skipped, and the old data is dumped in step 542 when the new data is written to the first level of the buffer. Preferably, step 542 involves overwriting the first level of the buffer with the new data. Alternatively, the old data may be passed to a sink, such as the optional sink 164 shown in FIG. 4. From step 542 or 550, depending on whether the buffer is gated, the conversion logic 130 returns to step 510 and initiates new conversions as fast as possible. Steps 510–550 are continuously repeated to store newly converted digital values in the buffer. Therefore, even if the analog-to-digital I/O board is not accessed by the PCI bus driver 142, the ADC performs a free-running conversion at a high speed.

While the ADC performs the free-running conversion illustrated in steps 510–550, the I/O driver 142 may, from time to time, determine that the real-time application requires a converted digital value from the I/O board 110. When a converted value is needed, the I/O software driver 142 issues a read event in step 560 of FIG. 5B to initiate a read of a converted value from the first channel in a list of selected (running) channels in the I/O board 110. At the time that the real-time application requires a converted digital value, the I/O driver 142 initiates a read of a converted value from the I/O board 110 in step 560, and implements a gate between the first level and the second level of the buffer in step 570. The gate temporarily suspends the push command. While the gate is deployed, newly converted values replace old data values in the first level of the buffer, which are lost. If a push command in step 550 of FIG. 5A is in progress when the I/O driver initiates access of the I/O board in step 560, the gating step of 570 is delayed until the push command is complete. Waiting for completion of an already in progress push command, if necessary, will generally take no longer than ten nanoseconds.

The I/O driver then retrieves a converted digital value from the second level of the buffer in step 580. According to the illustrative embodiment, the I/O driver, in step 580, reads all the converted values from the second level 162b of the buffer 160. After the read access of the last channel in the list of selected channels is reached, the gate on the push command is removed in step 590 to ensure that newly converted digital values will be pushed through the buffer and the read process can begin again when necessary. In step 592, which may be performed simultaneously with step 590, the retrieved digital values are passed to the real-time hardware for use by an application therein.

After deploying the gate at the command of the software in step 570, the ADC continues to execute steps 510–550 to continue the conversion of analog signals while steps 570–580 execute in FIG. 5B. In this manner, the ADC conversions are still in free-running mode during reading of the converted digital values from the second level of the buffer by the I/O driver in step 580. However, because the push command is held by the gate, the second level 162b of the buffer will not get corrupted with new data. The first level buffer 162a being overwritten with newer values from the ADC, but the newly converted values do not get pushed to the second level of the buffer. After the gate is removed in step 590, the newly converted values will be pushed to the second level of the buffer, rather than be overwritten in the first level. Even if the I/O driver 142 does not initiate a read of a converted digital value from the I/O board and execute the steps 560–592 in FIG. 5B, steps 510–550 illustrated in FIG. 5A continuously execute in the illustrated loop.

The intermediate memory 160 also allows read attempts to have a defined upper response time. Without the upper response time, the driver code may be time-nondeterministic or temporally nondeterministic, which is unacceptable for a real-time system.

Figure 6A:
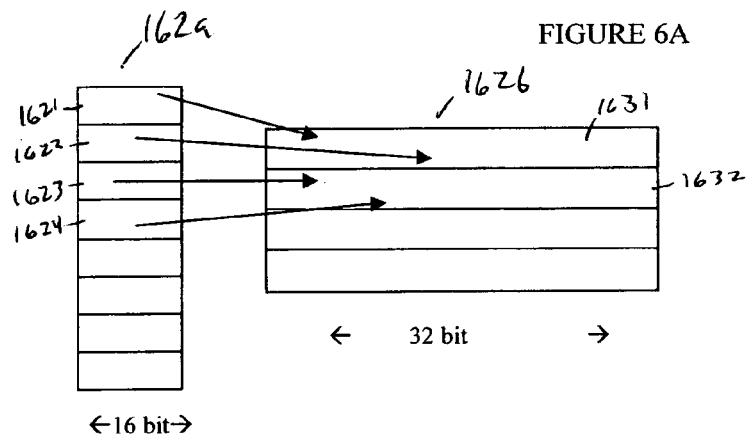
FIGS. 6A and 6B are schematic illustrations of the mapping between the first level of the buffer and the second level of the buffer in the intermediate memory of FIG. 4 according to illustrative embodiments of the invention.
Figure 6B:
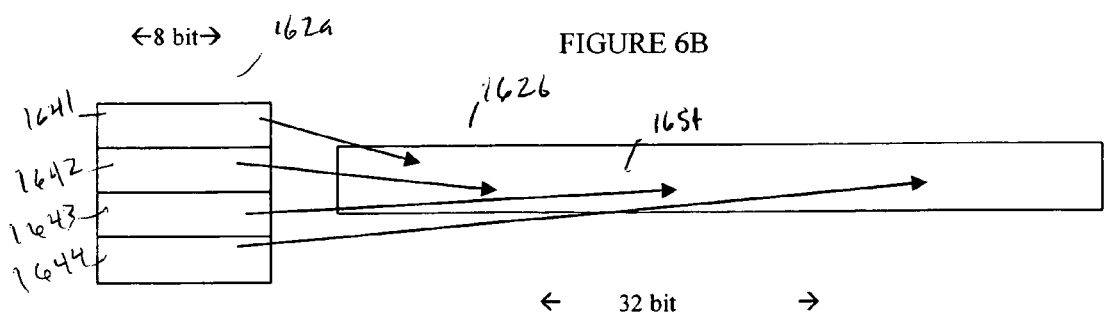

FIGS. 6A and 6B illustrates the packing of data from the first level of the buffer to the second level of the buffer 162 during the push command 550 of FIG. 5A, according to different embodiments of the invention. As described above, the illustrative embodiment of the invention employs a packing scheme for packing data from N fields in a first level of the buffer into M fields in the second level of the buffer, where M is preferably less than N.

For example, in the embodiment of FIG. 6A, the first level 162a of the buffer 160 has a depth of eight fields corresponding to eight analog channels. Each field has a capacity of sixteen bits. As shown, the second level 162b has four fields each with a capacity of thirty-two bits. According to the mapping scheme shown in FIG. 6A, during a push command, the values from the first two fields 1621, 1622 of the first level are mapped to the first field 1631 of the second level, which has twice the capacity of the first level fields. Values from the second two fields 1623, 1624 of the first level are mapped to the second field 1632 of the second level, and so on. In this manner, the intermediate memory 160 minimizes the number of column interfaces with the bus and fully utilizes the bus width.

One skilled in the art will recognize that the mapping is not limited to a 2:1 ratio. For examples, as shown in FIG. 6B, data from four eight-bit fields 1641, 1642, 1643, 1644 from the first level may all be mapped to a single, thirty-two bit field 1651 on the second level. One skilled in the art will recognize that any suitable number of first level fields may be mapped to any suitable number of second level fields.

The maximum rate of conversions is given by the conversion time of a specific ADC 120, which is typically 1 µs for a 12 bit ADC. For this, the hardware logic 130 on the ADC I/O-board 110 outputs a conversion signal having a period that equals the conversion time. In this manner, the hardware logic 130 initiates the new conversions of all selected channels 112a–112l or ADCs 120a–120l, assuming a board with one ADC per channel, as soon as a former conversion finishes and the converted digital value has been stored away in the buffer and/or a gate has been implemented, if necessary, thereby providing continuous conversion of the analog signals. This leads to the same preferred asynchronous conversion scheme for controls applications as with the software-initiated conversion method but without the need of a software command initiating the conversions. Therefore, the driver 142 will not have to wait on the conversion to be finished between initiating conversion and retrieving a value.

A "very fast" controls application can be defined as an algorithm in need of a cycle time of 50 µs. Because modern analog-to-digital converters are fast (1 s conversion time for a 12 bit version), the converted data in the free-running conversion mode will not be 'older' than the conversion time (i.e., about 1 µs). Practically spoken, this means that a real-time control algorithm will be able to get converted data at the time point the driver 142 reads the converted data (i.e., immediate sampling).

According to the illustrative embodiment of the invention, the system 100 includes a dedicated analog-to-digital converter for each analog input channel. The use of a dedicated ADC for each analog input channel minimizes latency in the ADC I/O-board design. This also has the advantage that all channels are sampled simultaneously (no channel time skew) if the ADC conversion is initiated simultaneously. The present invention may also be used in a system including a single ADC for all analog input channels or multiple ADCs sharing analog input channels. In such systems, simultaneous sampling is also possible by using sample and hold circuitry. However, this may introduce additional latency through the circuit's settling time.

Typical analog-to-digital converters for controls applications have a resolution of between about eight and about sixteen bits. The bus width of a PCI is either thirty-two bits (current standard) or sixty-four bits (evolving standard). For example, the bus access time for a 32-bit/33 MHz bus is the same (0.8 µs) independent if an 8-bit, 16-bit, or 32-bit register is accessed on the I/O-board. In order to minimize the overall latency, each bus access preferably occurs with a width equal to the bus width of the PCI bus 140. This means that the first level 162a of the ADC buffer preferably has a width equal to the resolution of the ADC, as described above, while the second level 162b of the buffer preferably has a width equal to the bus width of the PCI bus 140.

Therefore, the push command will also make sure that several first level buffer entries get packed into a single second level entry if possible. For example, a board with 16-bit ADC converters would pack two channels (two converted values) into one 32-bit second level buffer. From a driver's perspective, the driver 142 reads two converted values at once and therefore reduces latency by a factor of two. For the 64-bit PCI bus, the reduction of latency is even greater.

The specifications of an ADC I/O board implementing the conversion method of the illustrative embodiment of the invention show significant improvements, particular with regards to latency and timeliness. For example, the calculations below assume an ADC-I/O board with N (i.e., 8) channels, each channel having a dedicated analog-to-digital converter (ADC). The conversion time is Tc (i.e., 5 µs for a typical 16-bit ADC). The PCI bus is 32 bit/33 MHz having an atomic read and write access time of Ta (i.e., 0.8 µs). The maximum delay the Push command can cause for the first read is Tp (i.e., 100 ns). An ADC I/O-board using the free-running conversion methods of the illustrative embodiment of the invention may cut latency by almost a third.

For calculating latency, the latency time (T1) formula is: T1=(N*Ta)/2+Tp. For the example described above, T1= (8*0.8 µs)/2+100 ns=3.3 µs for the free-running conversion mode of the illustrative embodiment of the invention.

The part of the driver code not accessing the PCI bus may introduce latency as well. However, this additional latency is negligible, because this is code executed at the clock rate of the CPU.

The ADC I/O-board with the lowest latency in the current state of the art has the latency formula: T1=Ta+Tc+N*Ta. For the example described above, T1=0.8 µs+5 µs*8*0.8 µs=12.2 µs, which is about three times a long as the latency induced using the free-running mode of the illustrative embodiment of the invention.

A standard ADC I/O-board (one converter for all channels) has a typical latency time of: T1=Ta+N*(Tc+Ta). Therefore, the standard board has a latency of 47.2 µs (T1=0.8 µs+8* (5µs+0.8 µs)=47.2 µs), which is significantly higher than the latency of the I/O board of the present invention.

The ADC I/O-board implementing the conversion method of the illustrative embodiment of the invention has enhanced timeliness. For example, the illustrative I/O board will deliver converted data having the following maximum 'age' (Td, maximum time difference between request of the data and the sampling of the analog signals). Td=Tc. For the illustrative example, Td=5 µs. Td will decrease if faster ADCs are used. For standard ADC I/O-boards Td is equal to Ta, which is 0.8 µs.

As described above, the free-running conversion method of the illustrative embodiment of the invention significantly reduces the amount of time a computer system spends accessing signals from an I/O board. The free-running method further minimizes the interval between the time when data is converted and the time when converted data is accessed.

The present invention has been described relative to an illustrative embodiment. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

The invention claimed is:

1. A method of controlling conversion of a signal from analog form to digital form, comprising the steps of:
    continuously converting an analog signal from an analog channel into a digital form;
    storing values representing the digital form of the signal in a first level of a buffer;
    pushing the digital form of the signal from the first level of the buffer to a second level of the buffer;
    determining whether a digital form of the signal is required by an application; and
    if the digital form of the signal is required, retrieving a digital value from the second level of the buffer.

2. The method of claim 1, further comprising the step of overwriting a buffered digital value if the digital form of the signal is not required.

3. The method of claim 1, wherein a gate prevents pushing of data from the first level of the buffer to the second level during the step of retrieving.

4. A method of controlling a conversion of a signal from analog form to digital form, comprising m/e steps of:
    applying an analog signal to an input of an analog-to-digital converter;
    converting the analog signal into a first digital value using the analog-to-digital converter;
    buffering the first digital value in a first level of a buffer; and
    pushing a stored digital value from the first level of the buffer to a second level of the buffer in the absence of a gate between the first level and the second level when the first digital value is buffered in the first level of the buffer.

5. The method of claim 4, wherein the step of pushing comprises packing data from N fields in the first level to a number of fields in the second level that differs from N.

6. The method of claim 4, further comprising the step of reading the stored digital value from the second level of the buffer.

7. The method of claim 6, further comprising the step of deploying a gate between the first level and the second level before the step of reading the stored digital value to block the step of pushing the stored digital value.

8. The method of claim 7, further comprising the step of removing the gate after completing the step of reading the stored digital value to allow transfer of data between the first level and the second level.

9. The method of claim 4, further comprising the steps of:
    converting the analog signal to a second digital value using the analog-to-digital converter; and
    buffering the second digital value in the first level of the buffer.

10. The method of claim 9, further comprising the step of pushing the second digital value from the first level of the buffer to the second level of the buffer.

11. The method of claim 4, wherein the step of converting is repeated after each step of converting and buffering.

12. A method of controlling conversion of a signal from analog form to digital form, comprising the steps of:
providing a buffer having a first level for storing a first set of digital values and a second level for storing a second set of digital values; and
selectively deploying a gate to prevent transfer of data from the first level of the buffer to the second level of the buffer.

13. The method of claim 12, wherein the buffer receives newly converted digital values in the first level from an analog-to-digital converter.

14. The method of claim 13, wherein the analog-to-digital converter periodically and continuously supplies newly converted digital values to the first level of the buffer.

15. The method of claim 12, further comprising the step of selectively retrieving a buffered digital value from the second level using an I/O driver.

16. The method of claim 15, wherein the gate is deployed during the step of retrieving to prevent transfer of data from the first level of the buffer to the second level of the buffer during the step of retrieving.

17. The method of claim 15, wherein the step of selectively retrieving is executed when an application coupled to the I/O driver requires a digital form of an analog signal.

18. The method of claim 15, wherein the step of retrieving comprises sequentially retrieving a plurality of buffered digital values from a series of entries in the second level of the buffer.

19. The method of claim 13, further comprising the step of passing the retrieved buffered digital value to an application.

20. An analog-to-digital converter input-output system, comprising
an input-output board including a number of analog channels, each for conveying an analog signal;
at least one analog-to-digital converter, each analog-to-digital converter having an input coupled to at least one analog channel for continuously converting data in the analog channel to digital form;
a double buffer having a fire level coupled to an output of the analog-to-digital converter; and
an expansion bus configured to communicate with a second level of the buffer.

21. The system of claim 20, wherein the first level of the buffer has a depth equal to the number of analog channels.

22. The system of claim 20, wherein the at least one analog-to-digital converter comprises a number of analog-to-digital converters.

23. The system of claim 22, wherein the first level of the buffer has a depth equal to the number of analog-to-digital converters.

24. The system of claim 22, wherein the second level of the buffer has a width equal to a width of the expansion bus.

* * * * *